United States Patent [19]
Reuschel

[11] 4,068,020
[45] Jan. 10, 1978

[54] METHOD OF DEPOSITING ELEMENTAL AMORPHOUS SILICON

[75] Inventor: Konrad Reuschel, Vaterstetten, Germany

[73] Assignee: Siemens Aktiengesellschaft, Berlin & Munich, Germany

[21] Appl. No.: 644,963

[22] Filed: Dec. 29, 1975

[30] Foreign Application Priority Data

Feb. 28, 1975 Germany .............................. 2508802

[51] Int. Cl.² .................... C23C 13/00; C01B 33/02; C23C 11/02
[52] U.S. Cl. ...................................... 427/85; 148/174; 357/63; 423/348; 423/349; 423/350; 427/82; 427/248 B
[58] Field of Search .......................... 427/82, 85, 248; 423/348, 349, 350; 148/174; 357/63

[56] References Cited

U.S. PATENT DOCUMENTS

| | | | |
|---|---|---|---|
| 3,446,653 | 5/1969 | Reuschel | 357/63 |
| 3,461,359 | 8/1969 | Raithet | 357/63 |
| 3,476,640 | 11/1969 | Sirtl | 427/429 |
| 3,485,684 | 12/1969 | Mann | 357/63 |
| 3,725,148 | 4/1973 | Kendall | 357/63 |
| 3,734,770 | 5/1973 | Price | 427/82 |
| 3,836,999 | 9/1974 | Nishizawa | 357/63 |
| 3,862,852 | 1/1975 | Kamins | 148/174 |
| 3,930,067 | 12/1975 | Gorrissen | 427/82 |

*Primary Examiner*—Ralph S. Kendall
*Assistant Examiner*—John D. Smith
*Attorney, Agent, or Firm*—Hill, Gross, Simpson, Van Santen, Steadman, Chiara & Simpson

[57] ABSTRACT

A smooth surfaced amorphous silicon layer useful in semiconductor technology is produced by pyrolytic deposition of elemental silicon onto a heated mandrel along with simultaneous pyrolytic deposition of at least one other element selected from Groups IV through VIII and which is non-semiconductive and does not function as a conductivity determining dopant.

5 Claims, 1 Drawing Figure

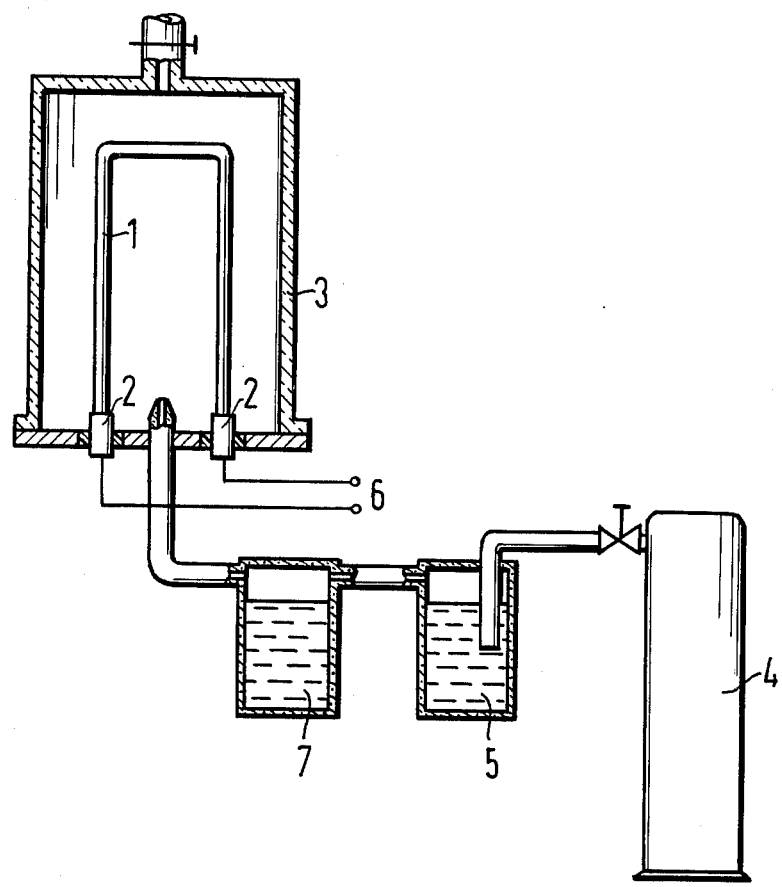

METHOD OF DEPOSITING ELEMENTAL AMORPHOUS SILICON

BACKGROUND OF THE INVENTION

The invention relates to the production of elemental silicon and somewhat more particularly to a method of producing smooth surfaced elemental amorphous silica.

PRIOR ART

German Pat. No. 1,521,465 (which substantially corresponds to U.S. Pat. No. 3,476,640) and an article in Journal of Electrochemical Society, Vol. 113, No. 5, pp. 506 through 508 (May 1966) suggest that elemental silicon may be pyrolytically deposited from a gaseous reaction mixture suitable for thermal or pyrolytic deposition of silicon onto a heated surface of a mandrel or carrier member which is positioned in contact with the gaseous reaction mixture. The carrier member is described as being composed of a heat-resistant material which is relatively inert to silicon and to the gaseous reaction mixture. During silicon deposition, it is suggested that another element (carbon) which promotes the production of an amorphous microcrystalline structure in the deposited silicon layer and which is relatively non-volatile at the deposition temperature be simultaneously deposited with silicon and incorporated within the growing silicon layer in such a manner that the semiconductive character of the deposited layer is unaltered.

The foregoing prior art is directed to a method of depositing a smooth surfaced (texture-free) silicon layer by simultaneously depositing carbon atoms along with silicon atoms from a suitable gaseous reaction mixture so that the carbon atoms are incorporated within the deposited layer in the form of silicon carbide. The composition of a gaseous reaction mixture suitable for such deposition is suggested as comprising a mixture of $H_2$, $SiHCl_3$ and $CH_3SiHCl_2$ in a ratio of 1:2:60. It is suggested that a stream of such a gaseous reaction mixture be guided so as to encompass the surface of a carrier member composed of Si, $SiO_2$, $Al_2O_3$, graphite or procelain which has been heated to a temperature of at least about 1000° C. German Pat. No. 1,521,465 also suggests that the so-produced silicon layer may have utility in the maufacture of semiconductor elements, for example, in the manufacture of diodes.

Journal of Applied Physics, Vol. 43, No. 1, pp. 83 through 91 (January 1972) and Solid State Electronics, Vol. 15, pp. 789 through 799 (1972) discuss the possibilities of utilizing polycrystalline silicon in semiconductor technology. These publications suggest that the fusion rate of dopants in polycrystalline material is not favorable for bipolar semiconductor structures.

In view of the statements in German Patent No. 1,521,465, the possible use of microcrystalline amorphous silicon in semiconductor technology appears to be more favorable. However, as disclosed therein, a silicion layer produced in accordance with the described method is composed of very fine grained silicon particles which contain between or at the grain boundaries thereof particles of silicon carbide. Accordingly, a non-homogenous structure is necessarily obtained, even if the small size of the silicon grains do not allow the optical recognition of surface irregularities or surface texture on such layer. Of course, non-homogeneous structures have non-homogeneous electrical properties and are thus not suited for semiconductor technology.

SUMMARY OF THE INVENTION

The invention provides a method of obtaining a smooth glasstype layer of deposited silicon which is characterized by a very high resistance in intrinsic conductivity and is undoped so that it is useful in producing semiconductor elements having pn-junctions, for example, as in solar cells.

In accordance with the principles of the invention, elemental silicon is pyrolytically deposited substantially simultaneously with at least one other element which promotes the production of a microcrystalline amorphous crystal structure but which neither determines the conductivity type to any extent worth mentioning nor has semiconductor properties per se. Silicon and such other element are deposited by pyrolytically or thermally decomposing compounds thereof in a gaseous reaction mixture which includes sufficient amount of such other element so that the concentration thereof exceeds the solid state solubility threshhold of this element in monocrystalline silicon but insufficient amounts thereof to form a silicide within the deposited layer.

BRIEF DESCRIPTION OF THE DRAWING

The FIGURE shows a somewhat schematic elevated view of a more or less conventional deposition apparatus useful in the practice of the invention.

DESCRIPTION OF THE PREFERRED EMBODIMENTS

In accordance with the principles of the invention, a smooth surfaced amorphous and relatively homogeneous layer, principally composed of elemental silicon and having a minor amount of at least one other element therein is obtained by a pyrolytic deposition process.

Such other element must be one which promotes the formation of microcrystalline amorphous crystal structure but which neither determines the conductivity-type to any extent worth mentioning (i.e. is not a dopant in the conventional sense) nor has semiconductor properties itself. Of course, such element must be capable of forming volatile or relatively volatile compounds which pyrolytically decompose to yield such element. In view of the above requirements, the donor and acceptor atoms of the V and III groups in the Periodic System of Atoms are unsuitable and are thus eliminated for use in the practice of the invention. This conclusion is also valid for most of the elements or atoms in the remaining groups of the Periodic System, with the exception of the IV group, as well as Ca, Mg and S. However, Ge must be eliminated from the IV group, while C may be used, as is suggested with the process described in German Pat. No. 1,521,465.

In addition, the metallic elements of the IV, V, VI, VII and VIII groups of the Periodic System are useful insofar as such metals form sufficiently volatile halogenides, hydrides, oxides or organo-metallic compounds which allow the addition of such elements to a conventional silicon-yielding gaseous reaction mixture typically used in the pyrolytic deposition of silicon.

Referring briefly to the drawing, a rod-shaped carrier member or mandrel 1 composed, for example, of silicon, is mounted at the ends thereof on electrodes 2 within an enclosure or housing 3 defining a reaction chamber therein. The housing 3 also functions as a flow-through container for the gaseous reaction mixture and may include appropriate valve means for regulating the flow of such gaseous mixture.

Typically, the gaseous reaction mixture is comprised of hydrogen charged with SiHCl$_3$ produce in a conventional manner and includes a minor amount of another compound yielding at least one desired additional element. In the arrangement illustrated, hydrogen is passed from a gas pressure tank 4 into an evaporator or container 5 filled with liquid SiHCl$_3$ so that when the gaseous H$_2$ passes through the liquid SiCHl$_3$, a portion thereof volatilizes and becomes entrained with the H$_2$. A mol ratio of H$_2$ to SiHCl$_3$ in the range of about 1:0.5 to 1:0.12 is preferable within the gaseous reaction mixture. Such a gaseous reaction mixture may then be guided into a relatively low volatility liquid which contains the other element to be co-deposited with silicon.

In embodiments where such other element is C, the liquid may comprise a relatively non-volatile hydrocarbon or a mixture of hydrocarbons in a flow-through container 7 positioned downstream of the container 5. In this manner, the stream of hydrogen having a silicon compound entrained therewith passes through the liquid hyrocarbon and vaporizes a very small portion thereof so that the gaseous stream contains a silicon-yielding compound and the other element-yielding coupound and is then guided into the reaction chamber of housing 3. An exemplary non-volatile or relatively low volatile liquid hydrocarbon is a purified lubrication oil, such as a motor oil or some other relatively non-volatile liquid oil on a KW-base, which is at room temperature. The rate of flow of the gaseous reaction mixture through the container 7 is appropriately adjusted, as by a combination of pressure and valve means, to be in the range of about 70 through 100 m$^3$/h. Of course, the incorporation of a select element into the gaseous reaction mixture may also be achieved in some other manner, for example, by placing an open dish or container filled with a liquid composition including such element therein in the reaction chamber within housing 3 and allowing it to slowly vaporize at the deposition temperature within the reaction chamber and thus be brought into contact with the heated mandrel surfaces.

A controlled current source 6 is operationally connected to electrodes 2 in a conventional manner and heats the carrier member to a temperature in the range of about 800° to 1150° C.

The silicon layer (which although not pure silicon, is nevertheless mostly composed of silicon) which is deposited on the carrier member 1 under the foregoing conditions exhibits a smooth glass type surface, which on mechanical overloading shows seashell-type break points or lines. In instances where C is co-deposited with Si under the foregoing conditions, no silicon carbide can be detected and in instances of co-deposition of other elements, no corresponding silicides appear present in the deposited layer.

On the other hand, the specific resistivity of the silicon layer deposited in the above described manner, but without conventional dopants or without a sufficient concentration of a microcrystalline amorphous structure inducing element to cause conductivity inclusions is about 10 to 2000 ohm · cm. Of course, the method of the invention might be altered for the production of doped silicon but in that instance, the gaseous reaction mixture must be provided in a conventional manner with a suitable dopant-yielding compound, for example, a halogen or a hydride of an element in the III or V group of the Period System of Atoms.

In the practice of the invention, reaction conditions are so selected that a silicide of the element co-deposited with silicon is not formed. Nevertheless, the practice of the invention requires that the temperature used during the deposition process be kept below a certain level, depending on the nature of the other element being co-deposited with silicon. In instances where such other element is C, the deposition temperature is maintained below about 1200° C.

In addition, the practice of the invention requires that the concentration of the element being co-deposited with silicon is carefully controlled. The amount of this other element in the deposited layer must definitely exceed the solid state solubility threshold of such element in monocrystalline silicon at the use temperature of silicon (generally room temperature). However, the amount of this other element must be sufficiently low to avoid forming conductive or semiconductive inclusions within the deposited silicon layer. In the exemplary embodiment discussed earlier, the amount of carbon in the gaseous reaction mixture required to achieve the proper concentration thereof in the deposited layer is, at a maximum, about 5% by weight and more preferably is about 0.1% by weight. The earlier mentioned heavy oils (relatively non-volatile) which supply carbon to the gaseous reaction mixture have just the right evaporation rate at room temperature to insure a suitable carbon content in the reaction mixture for a proper carbon concentration in the deposited layer and for a relatively quick deposition rate (i.e. a growth rate of about 0.1 to 0.8 mm/h).

If a metal of the IV or VIII group of the Periodic System of Atoms or Sn or Pb is selected as the element to be co-deposited with silicon, then the deposition temperature must generally be lowered so as to avoid silicide formation. Preferably, a maximum temperature level of about 1100° C. should be maintained. However, a suitable volatile compound of the select element for co-deposition with silicon must be available in order to enable a sufficient amount of such element to be admixed into the gaseous reaction mixture. Exemplary volatile or relatively volatile compounds of some select elements which may be co-deposited with silicon are, for example, $CH_3Mn(CO)_5$, $Ni(CO)_4$, $CrO_2Cl_2$, $MoCl_5$, $NbF_5$, $SCl_2$, $SOCl_2$, $CS_2$, $SOBr_2$, $TaCl_5$, $TiCl_4$, $VOCl$, $VOCl_2$, $VF_4$, $WCl_5$, $WOF_4$, $SnH_4$, $SnBr_4$, $SnCl_4$, and mixtures thereof as well as other similarly volatile compounds. It will be noted that not all of the foregoing exemplary compounds are binary and that some of such compounds contain, in addition to a metallic element, oxygen and/or carbon, such as the carbonyls. Thus, in certain instances, more than one element may be co-deposited with Si so that the invention comprises co-depositing at least one element promoting formation of amorphous silicon along with silicon and yet other elements may be co-deposited as long as they are non-detrimental and do not produce semiconductive or conductive characteristics in the deposited layer. For example, the presence of a relatively small amount of $O_2$, in addition to some other element promoting the formation of amorphous silicon, produces an improvement in the electrical properties of the deposited silicon as long as the amount of oxygen atoms is such that the number of oxygen atoms present does not exceed the number of atoms of the other element being co-deposited with oxygen and silicon. Generally, a concentration of about $2 \cdot 10^{16}$ atoms/cm$^3$ of the element co-deposited with silicon is desired. The solid-body solubility threshhold of a given element to monocrystalline silicon at room temperature provides a favorable standard concentration value for the amount of the select element being co-deposited with silicon and this value corresponds somewhat to the distribution coefficient of such element in zone melt treatment of silicon rods. The concentration of the co-deposited element, which may be controlled, is preferably selected so that the solid state solubility threshhold thereof in monocrystalline silicon at room temperature is exceeded by at least 5%. The maximum amount of such element is determined by the formation of conductivity inclusions or depositions of such element in the deposited layer. Generally, such conductive inclusions occur when the solid state solubility threshhold of said element in monocrystalline silicon is exceeded by four or five powers of 10. For example, the maximum solid state solubility of Ni in silicon is about $1 \cdot 10^{16}$ atoms/cm$^3$. Conductive forming bridges or the like occur when the Ni atom concentration reaches about $2 \cdot 10^{20}$ atoms/cm$^3$. Corresponding values for carbon are $3 \cdot 10^{17}$ atoms/cm$^3$ (for maximum solubility) and about $10^{21}$ atoms/cm$^3$ for formation of conductive inclusions. Values for other select elements may be easily determined as will be recognized by those skilled in the art.

The mandrel or carrier member 1 may be composed of C (graphite), low volatility metals having non-doping properties and ceramics instead of Si as mentioned earlier. Preferably, the surfaces of the carrier member are polished smooth. The mandrel may be heated by direct electric current passage, or by induction or by radiation from appropriate energy sources. The deposition rate is determined principally in relation to obtaining as good a yield as possible from the gaseous reaction mixture and in relation to as great a deposition rate as possible so that the desired silicon layer can be produced much more economically than a monocrystalline silicon layer.

Preferably, a gaseous reaction mixture flow rate within the reaction chamber or at least about the mandrel is regulated so as to be at least about 10 m$^3$/h.

The ultimately attained amorphous silicon layer may be further processed as desired in a conventional manner. For example, in order to produce pn-junctions, conventional procedures may be used, such as controlled diffusion of a select dopant from a conventional dopant source and/or by epitaxy techniques while using the silicon layer produced in accordance with the invention as a substrate. It should be noted that during dopant diffusion, the diffusion coefficient becomes larger than in normal polycrystalline silicon. Also, silicon deposited by epitaxy techniques becomes amorphous when such deposition occurs at lower temperatures, however, such silicon no longer has smooth or texture-free surface at temperatures above 1100° C. Accordingly, it is preferable to position pn-junctions in the silicon layer procured from the practice of the invention so that the pn-junctions are within the amorphous area thereof.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention as claimed.

I claim as my invention:

1. A method of producing silicon semiconductor devices composed of amorphous silicon and having at least one pn-junction therein, comprising:

pyrolytically depositing elemental silicon and a second element selected from the group consisting of, Cr, Fe, Mo, Mn, Ni, Sn, Ti, V and W from a gaseous reaction mixture containing thermally decomposable compounds of silicon and said second element onto a heated carrier member composed of a relatively inert material;

controlling the deposition temperature and the amount of the second element compound within the gaseous reaction mixture in such a way that the deposited silicon is in an amorphous state and includes therein an amount of said second element which exceeds the solid state solubility of said second element in monocrystalline silicon by at least 5% but which amount is insufficient for formations of the silicides and insufficient to form conductive inclusions within the deposited silicon; and diffusing a dopant material into the deposited silicon to produce at least one pn-junction therein.

2. A method as defined in claim 1 wherein the thermally decomposable second element compound is selected from the group consisting of $CH_3(Mn(CO)_5$, $CrO_2Cl_2$, $MoCl_2$, $Ni(CO)_4$, $SnH_4$, $SnBr_4$, $SnCl_4$, $TiCl_4$, $VOCl$, $VOCl_2$, $VF_4$, $WCl_5$, $WOF_4$ and mixtures thereof.

3. A method of producing silicon semiconductor devices composed of amorphous silicon, comprising:

pyrolytically depositing elemental silicon and a second element selected from the group consisting of S, Ca and Mg from a gaseous reaction mixture containing thermally decomposable compounds of silicon and said second element onto a heated carrier member composed of a relatively inert material; and controlling the deposition temperature and the amount of the second element compound within the gaseous reaction mixture in such a way that the deposited silicon is in an amorphous state and includes therein an amount of said second element which exceeds the solid state solubility of said second element in monocrystalline silicon by at least 5% but which amount is insufficient for formations of the silicides and insufficient to form conductive inclusions within the deposited silicon.

4. A method as defined in claim 3 including diffusing a dopant material into the deposited silicon to produce a pn-junction therein.

5. A method as defined in claim 3 wherein the thermally decomposable second element compound is $CS_2$.

* * * * *